United States Patent [19]
Wang

[11] Patent Number: 5,179,280
[45] Date of Patent: Jan. 12, 1993

[54] COMPUTER CONTROL OF THE ELECTRON MICROSCOPE SAMPLE STAGE

[75] Inventor: Liqin Wang, College Park, Md.

[73] Assignee: Chi & Associated Inc., Arlington, Va.

[21] Appl. No.: 596,387

[22] Filed: Oct. 12, 1990

[51] Int. Cl.$^5$ ............................................. H01J 37/26
[52] U.S. Cl. ..................................... 250/311; 250/307
[58] Field of Search ..................... 250/307, 311, 442.1, 250/310

[56] References Cited
U.S. PATENT DOCUMENTS
3,727,051 4/1973 Page ..................................... 250/311

FOREIGN PATENT DOCUMENTS
54-148255 8/1984 Japan ..................................... 250/311

*Primary Examiner*—Jack I. Berman
*Attorney, Agent, or Firm*—Watson, Cole, Grindle & Watson

[57] ABSTRACT

A method and apparatus for controlling the tilting of the sample stage of an electron microscope along X and Y axes are disclosed. A plurality of different orientations are displayed stereoscopically on a monitor with a spot representing the current orientation being highlighted. The control signals which cause the sample to tilt are generated by moving a cursor on the stereoscopic projection.

12 Claims, 7 Drawing Sheets

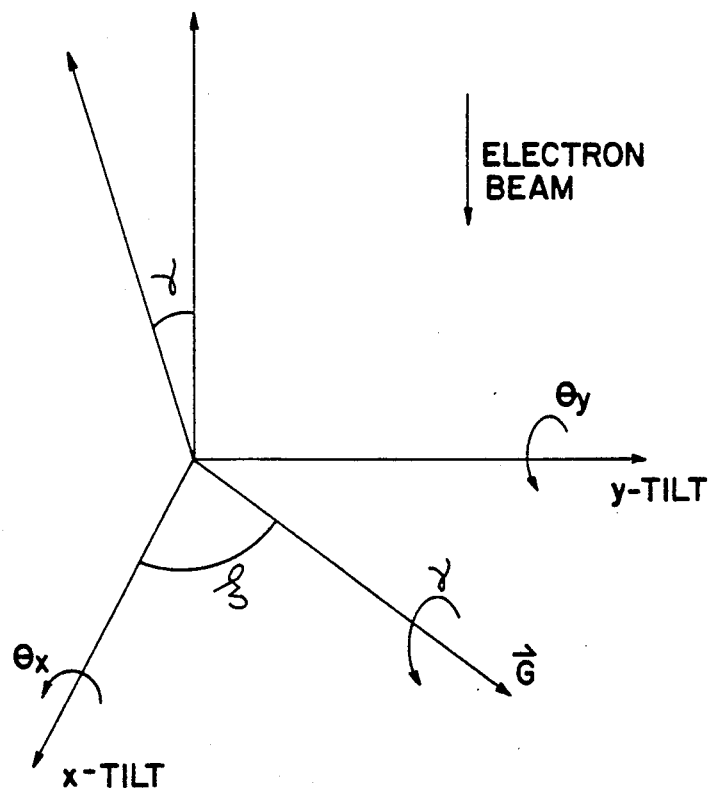
FIG.6
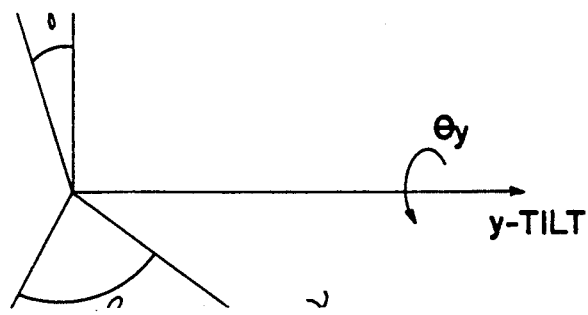

COMPUTER CONTROL OF THE ELECTRON MICROSCOPE SAMPLE STAGE

BACKGROUND OF THE INVENTION

1. Field of the Invention

This invention relates to electron microscopy and more particularly to the computer control of the tilting of the sample stage in transmission electron microscopes to enable the sample stage to be tilted along two perpendicular axes to re-orientate the sample without using diffraction mode.

2. Related Art

U.S. Pat. No. 3,727,051 discloses a control system with an electrical computing circuit for sensing tilting and the position of the point under observation to adjust the specimen stage in an electron microscope.

Electron microscopes, including transmission-electron microscopes (TEM) and scanning electron microscopes (SEM) have become one of the most important instruments in determining the microstructure of material. Unfortunately electron microscopes are difficult to operate and require significant operator experience and skill to obtain satisfactory information. A significant factor in the operation of an electron microscope is the proper tilting of the sample, as even experienced operators cannot be certain that optimum conditions exist when making an observation because of the many possible orientations of the sample.

Moreover, in known tilting systems, when the sample is tilted the operator needs to observe the diffraction pattern of the sample, which means that the image of the sample cannot be observed at the same time. Consequently, if the spot of interest of the sample moves off the image screen during tilting the spot of interest may be temporarily lost. Furthermore, when using a double tilt stage (the sample can be tilted in two perpendicular directions) the operator needs to switch back and forth between the diffraction mode and the image mode to make sure that the spot of interest remains in view with tilting of the sample. Even for experienced operators it is very difficult to maintain the spot within the screen area when tilting the sample stage for very small grain-sized polycrystalline samples or with samples containing more than one phase.

SUMMARY OF THE INVENTION

A primary object of the invention is to provide a programmed computer for informing the electron microscope operator of the number of degrees the sample is to be tilted and/or to provide signals for controlling a step motor at each of the x and y axes to accomplish the desired tilt of the sample stage without the need for the operator to switch between the diffraction and image projections.

A further feature of the invention is that the computer displays a stereographic projection of the crystal with a highlight spot which is the current orientation of the crystal and a highlighted region in which the crystal orientations can be reached by the current tilting stage as a function of the tilting angle limit of the stage.

Another advantage of the computer controlled sample stage of the invention is that once the operator has determined the orientation to be used, a cursor may be moved to that position on the stereographic projection and the computer will generate the necessary signals for controlling the step motors to automatically reposition the sample stage.

And yet a further feature of the invention is that of tilting the sample stage to a zone axis parallel to the electron beam and providing a random search for randomly tilting the sample stage within a preset angular region until the operator determines that the diffraction image contrast is improved. Then the sample stage is tilted along the strongest and/or shortest diffraction vector until a crystallographic zone axis is obtained. The tilting axes can be measured on the screen or by other methods known to skilled electron microscope operators. This technique is useful in those instances wherein the crystal structure and lattice parameters of the sample are known, but the orientation is random.

With a sample with unknown crystal structure, lattice parameters and random orientation, the above mentioned searches can be performed until a zone axis is obtained and then the sample stage is tilted along every diffraction vector and the reciprocal space is constructed within the angle region which is confined by the limit of the tilting angle of the stage. This is accomplished using the second of the searches specified above.

Finally, the cursor on the stereographic projections presented on the monitor and the sample stage orientation can be interacted, i.e. the cursor will move to the position where the crystal is to be tilted to, and once the cursor is set to a position on the projection representing a crystal orientation, the sample stage can be tilted to that orientation following a command input to the computer.

BRIEF DESCRIPTION OF THE DRAWINGS

The above objects, features and advantages of the invention are believed to be readily apparent from the following description of a preferred embodiment of the invention, which represents the best mode of carrying it out, when taken in conjunction with the drawings wherein:

FIG. 6 illustrates the tilting of the sample about tilting axes x and y.

DETAILED DESCRIPTION

Figure 1:
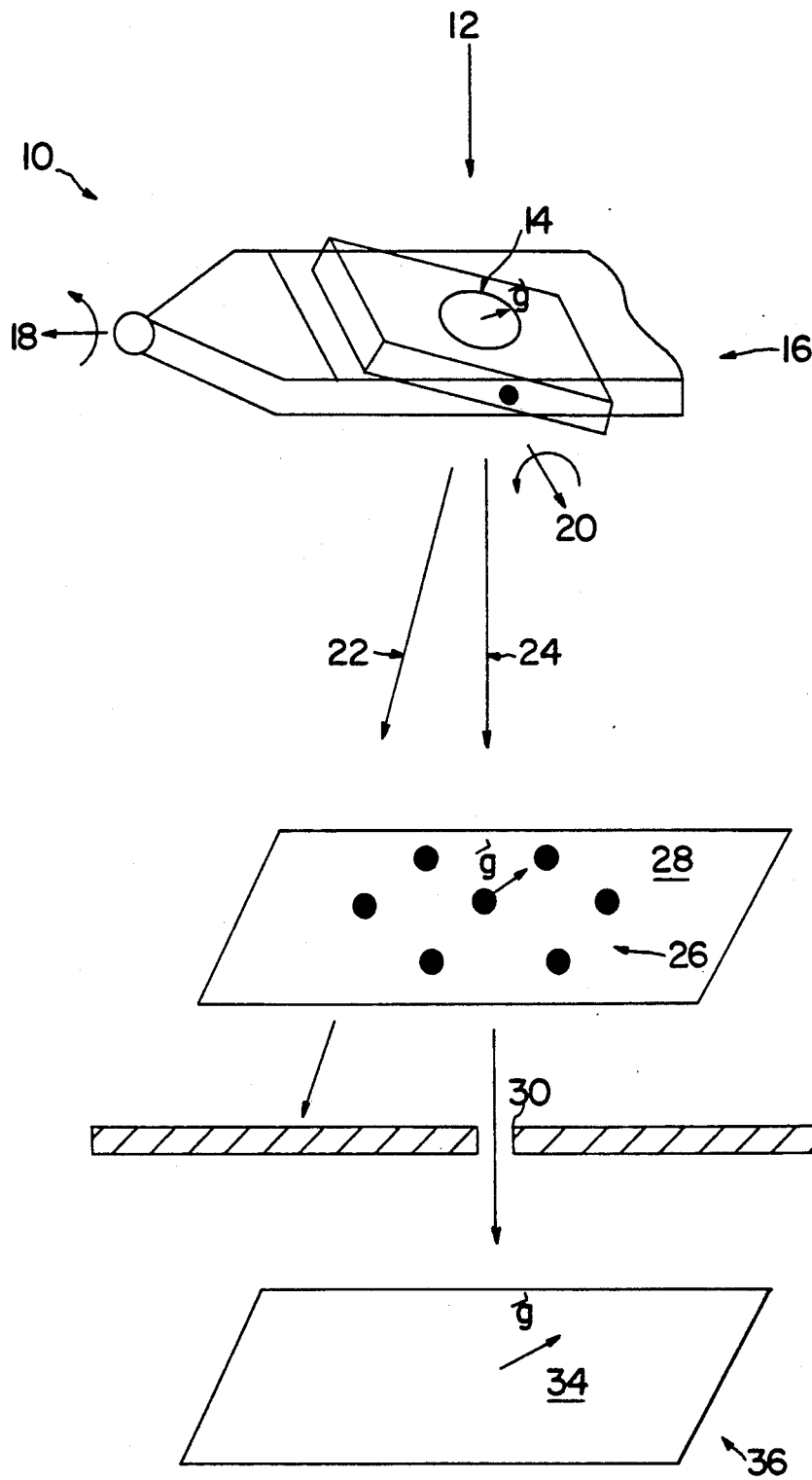
FIG. 1 is an exploded schematic representation of a known transmission electron microscope illustrating a double tilt sample stage, the diffraction and transmission beams, the diffraction pattern and the image produced through an aperture and to which structure the invention is applied.

In the exploded view of a portion 10 of an electron microscope illustrated in Figure electron beam 12 is directed toward sample 14 mounted on double tilt sample stage 16 in a manner known to those skilled in the electron microscopy art. Double tilt sample stage 16 is tiltable about respective x and y axes 18 and 20. The resultant diffraction beams 22 and transmission beams 24 produce a diffraction pattern 26 on screen 28 with the transmission beams 24 passing through aperture 30 in aperture plate 32 such that an image 34 is formed at image plane 36. g is a representation of one of the diffraction vectors. All of the components illustrated in FIG. 1 are known to those skilled in the electron microscope art.

Figure 2:
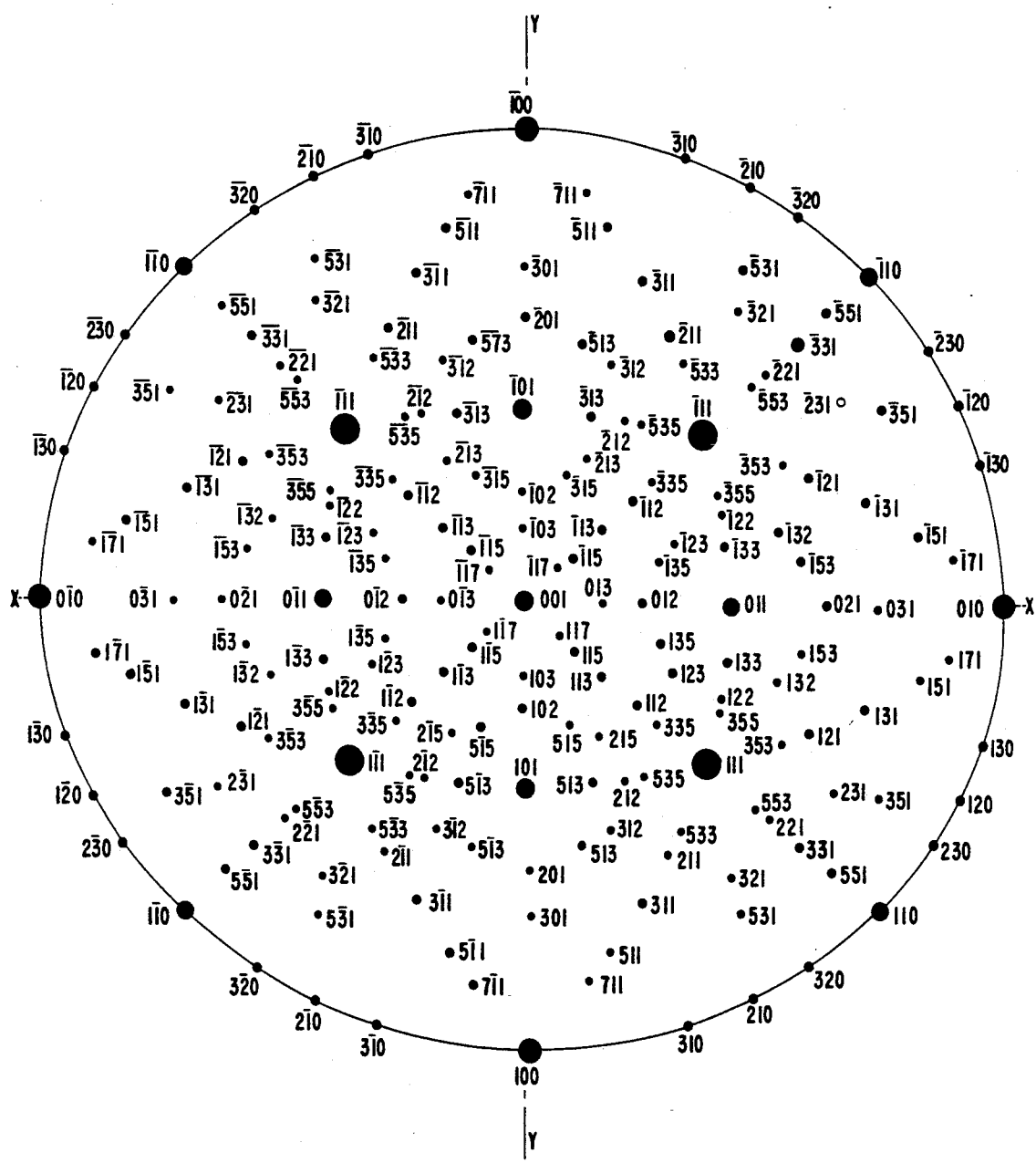
FIG. 2 illustrates a method of making stereographic projections in accordance with the invention.
Figure 3:
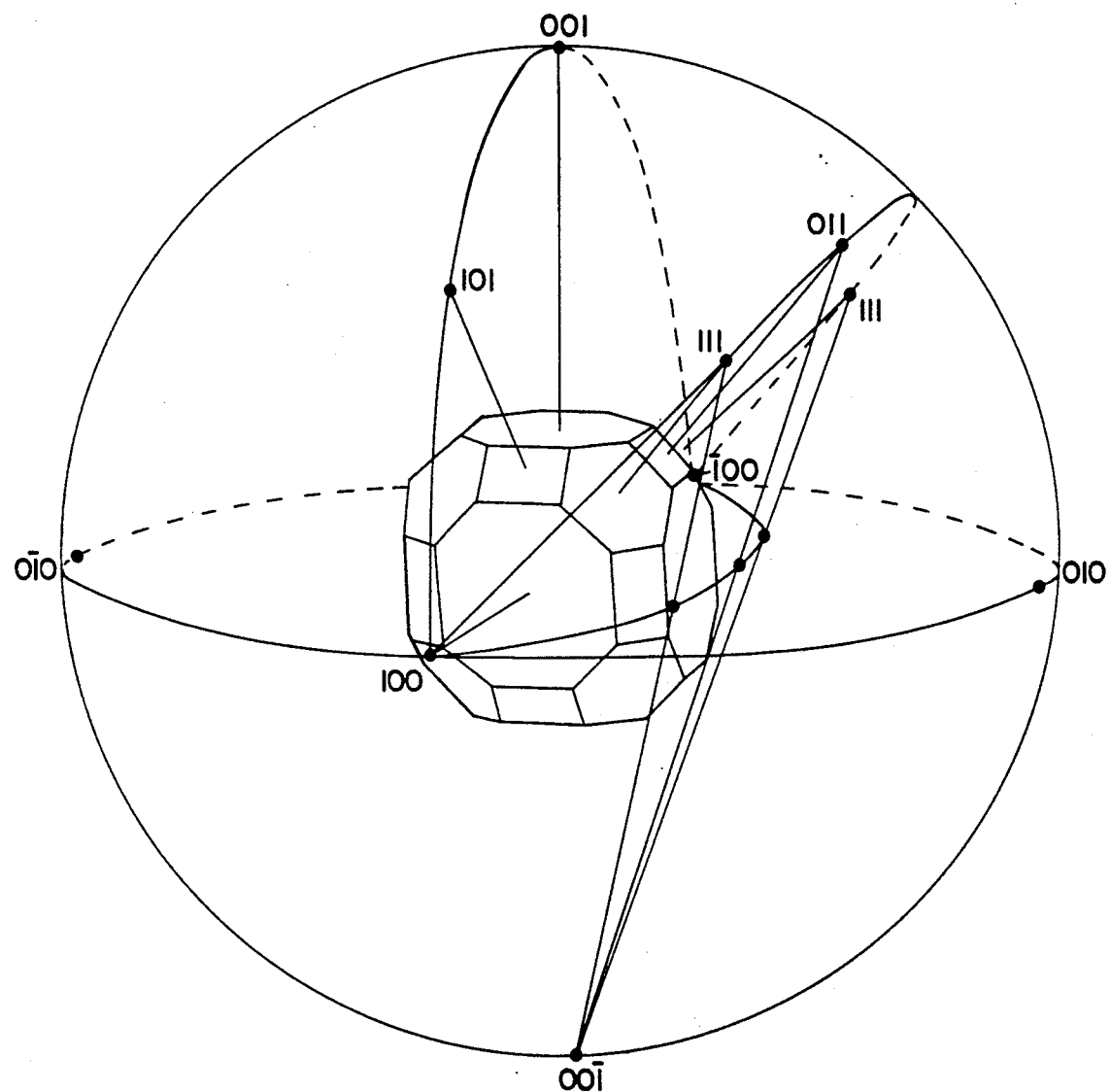
FIG. 3 is a stereoscopic projection of a cubic crystal structure as displayed on a monitor of the computer system and wherein each spot represents a crystal orientation.

FIG. 2 illustrates the manner in which the stereographic projection shown in FIG. 2 is produced. Each crystal orientation or plane can be represented by a vector which is the normal of the plane as shown in FIG. 3. This normal vector can also be represented by a point which is the intersection of the normal vector and a unit sphere. Through that point and the south pole a straight line intersects the equatorial plane. That point of intersection is the stereographic projection of the crystal plane represented by the normal vector. Therefore, each spot on the projection plane (or equatorial plane) mathematically represents a crystal orientation or plane. For a crystal orientation or plane indexed as [u,v,w] a unique (x,y) coordinate on the projection plane can be calculated by the following relationship:

$$(x,y)^t = \underline{M}^1 \cdot [u,v,w]^t$$

where $\underline{M}$ is a transformation matrix which is a function of crystal structure and lattice parameters. The preferred manner of making the stereographic projections is by programming a computer as will be described more fully hereinafter.

FIG. 3 illustrates a stereoscopic projection of a cubic crystal structure in the sample stage of an electron microscope in accordance with the invention wherein each spot represents a particular crystal orientation. Each crystal orientation or spot on the stereographic projection plane shown in FIG. 3 can be represented by a coordinate (x,y) which is defined by the equations:

$$x = \frac{A}{\sqrt{A^2 + B^2 + C^2 + C}} \cdot R$$

$$y = \frac{B}{\sqrt{A^2 + B^2 + C^2 + C}} \cdot R$$

where R is the radius of the projection and A, B, C are related to the crystal orientation index [u, v, W] by the relationship:

[A, B, C] = [u, v, w]·M and M is a 3×3 matrix defined as follows:

$$M = \begin{bmatrix} a\sin\alpha & a\cos\alpha & 0 \\ b\frac{\cos\gamma - \cos\alpha\cos\beta}{\sin\beta} & b\sqrt{\sin^2\alpha - \frac{(\cos\alpha - \cos\alpha\cos\beta)^2}{\sin^2\beta}} & b\cos\alpha \\ 0 & 0 & 0 \end{bmatrix}$$

where a, b, c and α, β, γ are crystal lattice constants which are known for a known crystal (documented crystal).

Therefore, from each [u, v, w] a spot or crystal orientation (x, y) on the stereoscopic projection plane can be calculated, and vice-versa. For example, for a cubic crystal a=b=c and α=β=γ=90 degrees; and $$M = a \begin{bmatrix} 1 & 0 & 0 \\ 0 & 1 & 0 \\ 0 & 0 & 1 \end{bmatrix} \text{ and}$$

$$x = \frac{u}{\sqrt{u^2 + v^2 + w^2 + w}} \cdot R$$

$$y = \frac{v}{\sqrt{u^2 + v^2 + w^2 + w}} \cdot R$$

The bigger spots on the stereographic projection of FIG. 3 represent the crystal planes or orientations which have smaller numbers on their index (called low indexed planes or orientations). Usually these low indexed planes or orientations are more important than that of the higher indexed planes or orientations. For instance, the crystal might be cleaved along some of the lower indexed planes (the facets on a diamond are low indexed crystal planes).

Figure 4A:
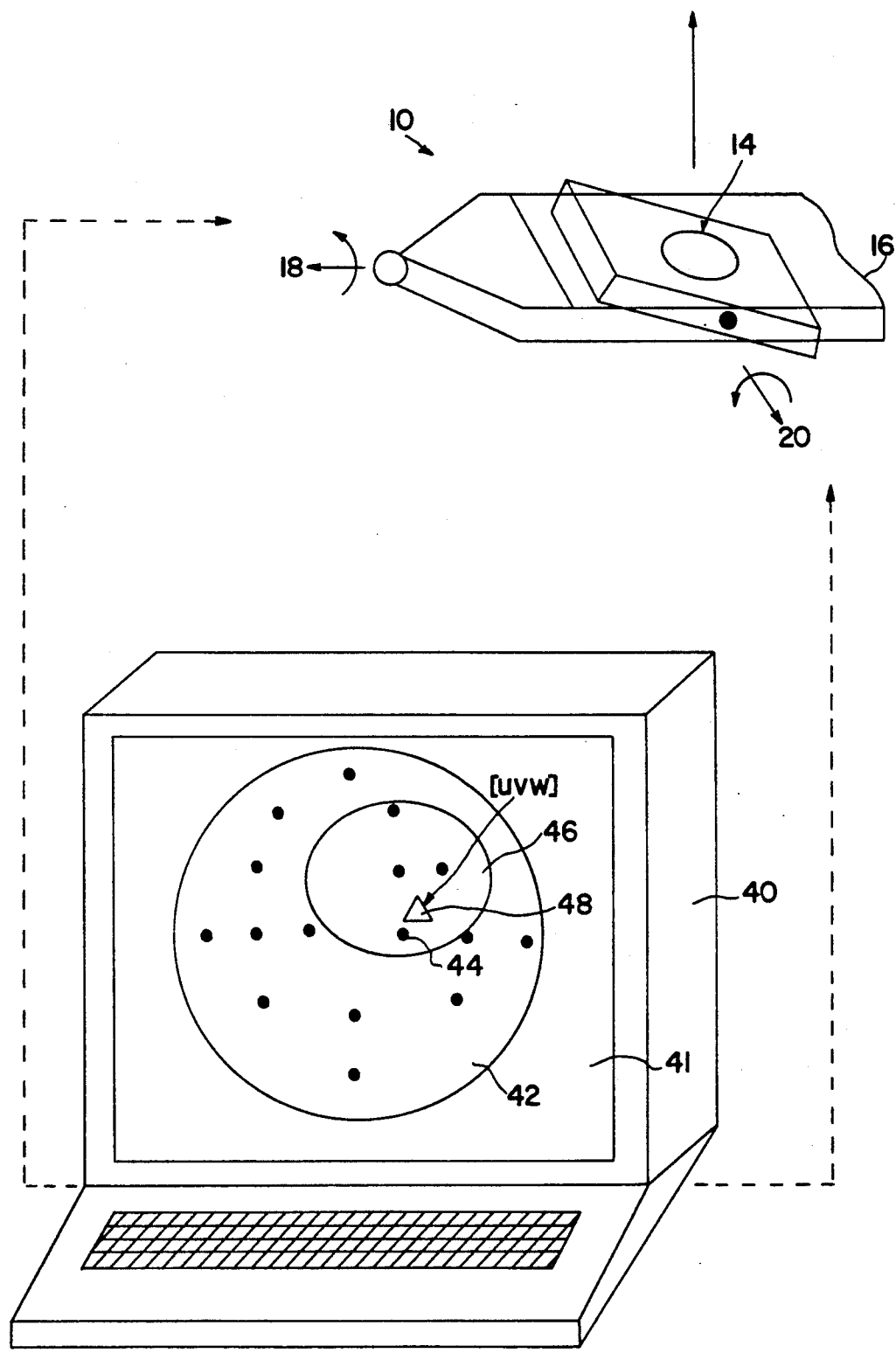
FIG. 4A is a combined block diagram and schematic representation of the computer system for presenting a crystal stereographic projection interacting with and controlling a double tilt sample stage of an electron microscope in accordance with the invention.

FIG. 4A shows a computer system for presenting a crystal projection interacting with and controlling the tilting of a double tilt sample stage of an electron microscope using and y tilt control signals from the computer to actuate respective and y step motors (not shown) on double tilt sample stage 16. The computer 40 is programmed to display the stereographic projection 42 of the sample 14 with a highlighted spot 44 which indicates the current orientation of the crystal and a highlighted region 46 indicating the crystal orientations that are attainable as determined by the tilting angle limit of the sample stage 16 after the computer/electron microscope operator has input data indicating the crystal structure, lattice parameters, current crystal orientation and the relative rotation angle corresponding to the tilting axis. Based on the stereoscopic projection 42, the computer/electron microscope operator selects the desired orientation by moving cursor 48, and then the computer 40 generates the necessary x and y tilt control signals to enable the respective x and y step motors to tilt the sample stage 14 to the selected orientation.

Figure 4B:
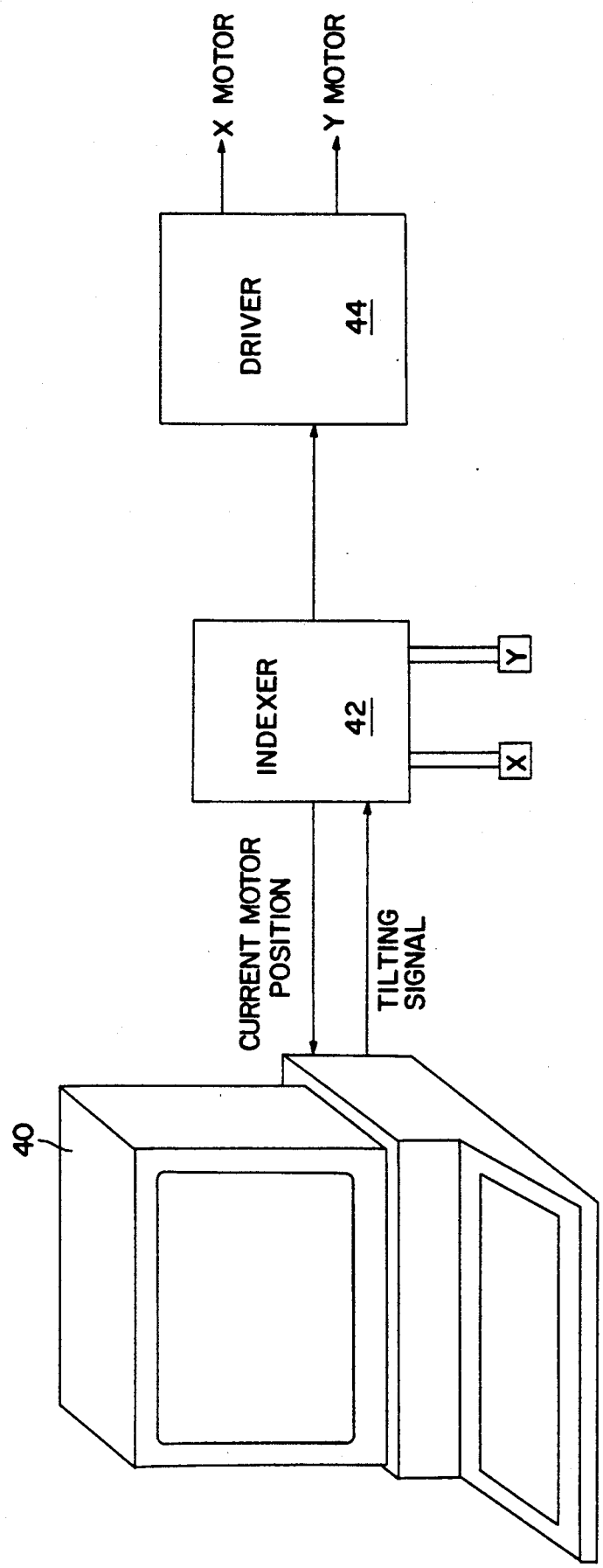
FIG. 4B is a block diagram of exemplary circuitry for generating the x and y axis tilting control signals in accordance with the invention.

A block diagram of the circuitry for generating the x and y tilt signals for controlling the titling of sample stage 14 is shown in FIG. 4B. Computer 40 receives current motor position signals from indexer 42 which also receives the tilting control signals from the computer 40. Indexer 42 may also be adapted to receive manual x and y tilt control signals as indicated in FIG. 4B. Indexer 42 provides a control input to driver 44 which generates the x and y motor control tilt signals. Each of the computer, indexer and driver circuits shown in FIG. 4B is known to those skilled in the are so that no detailed description of their respective structure is considered necessary for the purposes of the present invention.

The above description pertains to the case where the crystal orientation is known. In the situation where the crystal structure and lattice parameters are known, but the orientation is random, the sample is to be tilted to a zone axis parallel to the electron beam such that two sea can be performed. The first search is a random search in which stage can be randomly tilted within some preset angular region the operator determines that the diffraction image -- is improved, meaning that there are high intensity diffractions excited. In the second search method, sample stage 16 is tilted along the strongest and/or shortest diffraction vector after inputting the orientation angle between the diffraction vector and the tilting axes, which can be measured on the display screen 41.

The two search methods are considered to be equally important, although they each have different functions. The random search is an aid to the microscope operator to obtain a strong diffraction whenever the sample is originally placed in such an orientation that there is no strong diffraction excited. Once a strong diffraction is obtained, that means that such a diffraction vector is almost parallel to the plane defined by x-y tilting axes. Then, the second search method should be applied.

In a third situation where the sample has an unknown crystal structure, lattice parameters and random orientation, the second search mentioned can be used until a zone axis is obtained, then using that search method the sample 14 is tilted along every diffraction vector and the reciprocal space is constructed within the angle region which is confined by the limit of the tilting angle of the stage.

Tilting the sample along every strong diffraction G is accomplished by tilting the sample along the physical tilting axes x-y as shown in FIG. 6. If the sample needs to be tilted degrees about G, this tilting can be equivalently accomplished by tilting the sample about the and y axes $\Lambda_x$ and $\Lambda_y$ respectively, which is determined by:

$$\sin \theta_x = \sin \gamma \cdot \cos \epsilon$$

$$\sin \theta_y = \sin \gamma \cdot \sin \epsilon$$

Reciprocal space is the Fourier transformation of the real space of the lattice of a crystal which is determined by the crystal structures. Physically, electron diffraction patterns obtained from crystal have the form of reciprocal space of the crystal. Therefore, through the diffraction pattern, crystal structures and orientation information can be obtained.

Figure 5:
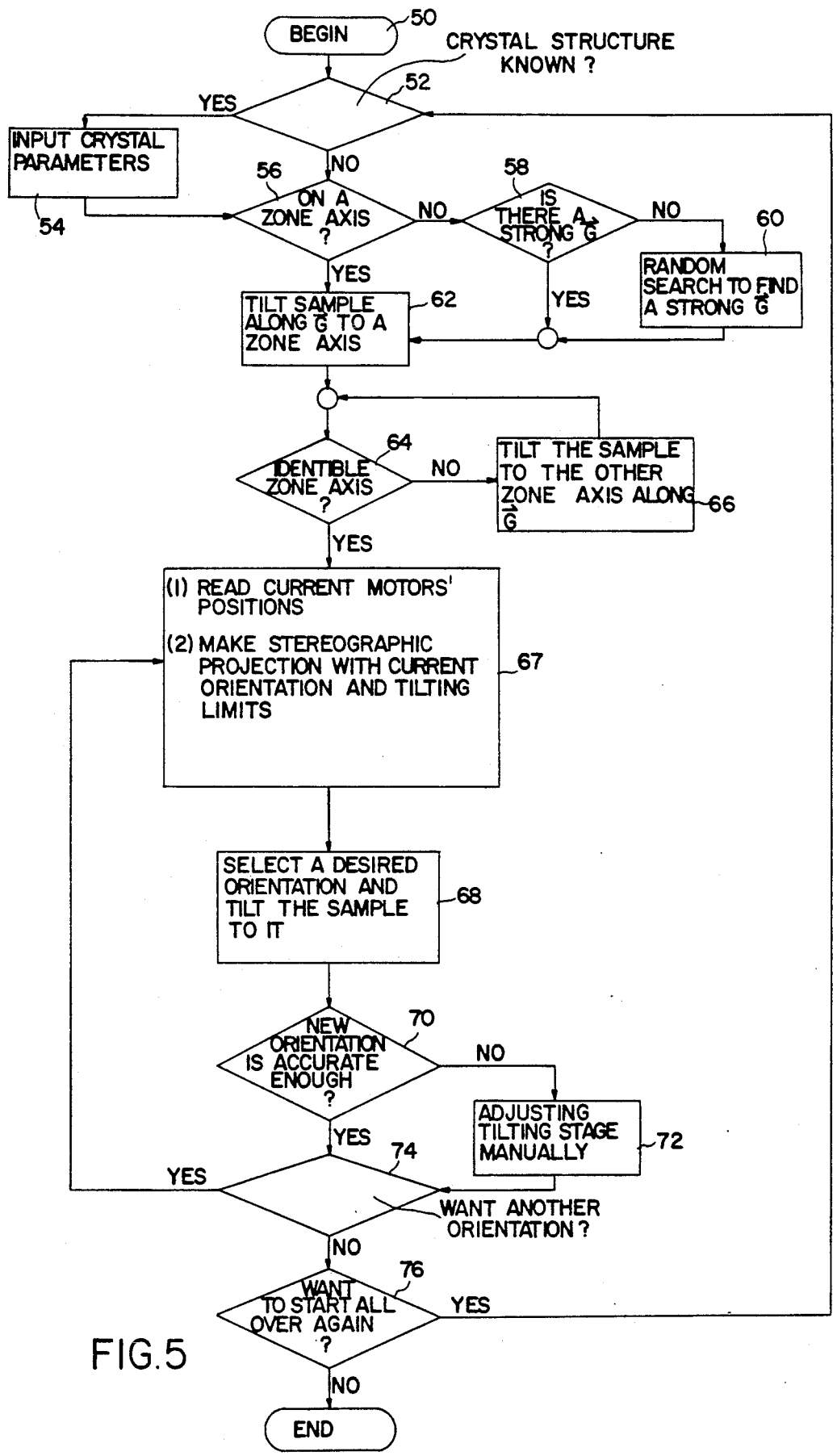
FIG. 5 is a flow diagram specifying the control functions carried out by the computer to carry out the invention.

FIG. 5 illustrates a flow chart of a program for controlling a computer to carry out the invention. The program is initiated at "begin" step 50, and if the crystal structure is known at step 52 the crystal input parameters are input at step 54, whereupon the program proceeds to step 56 to determine if the electron beam is on a zone axis. If the crystal parameters were not known, then the program would have proceeded from step 52 to step 54 directly. If the electron beam is not on a zone axis then a determination made at step 58 whether there is a strong G, and if not then the program proceeds to perform a random search at step 60 to find a strong G and then advances to step 62 to step 62 tilt the sample along G to a zone axis. However, if the electron beam is on a strong G, then the program advances directly to step 62. Returning to program step 56, if a determination is made that the electron beam is on a strong zone axis, then the program proceeds directly to step 62 to tilt the sample along G to a zone axis. From step 62 the program proceeds to determine whether the zone axis is identifiable at step 64, and, if not, then the sample is tilted to another zone axis along G at step 66. The program then proceeds to step 66 where (1) the current x and y motor positions are read; and (2) the stereographic projections are made with the current orientation and tilting limits. The program then proceeds to select a desired orientation and tilt the sample to it at step 68. The program then determines at step 70 whether the new orientation is accurate enough, and, if not, the program goes to step 72 to adjust the tilting angle manually, and then proceeds to step 74 to determine if another orientation is desired. However, if the new orientation selected at step 68 is accurate enough, the program then proceeds directly to step 74. If another orientation is desired the program returns to step 66. If another orientation is not desired, then the program proceeds to step 76 to determine if the operator wants to start all over again, and if the operator so indicates, the program returns to step 52. The program ends if the operator determines that he or she does not want to start over again.

The above described embodiments of the invention are of course provided to enable the subject invention to be practiced by one of ordinary skill in the art of electron microscope devices and apparatus and while the disclosed embodiments of the invention may be modified, however it is understood that the scope of the invention is not to be measured solely by the aforementioned embodiments but by the following claims and the various equivalents to which the elements thereof are entitled.

What is claimed is:

1. Apparatus for controlling the tilting of the sample stage of an electron microscope along respective x and y axes, comprising:
    means for tilting the sample stage about respective s and y axes in response to control signals;
    means for generating a plurality of different orientations of the sample and stereoscopically displaying said plurality of orientations on a monitor to form a stereoscopic projection to be observed by an operator; and
    means for generating said control signals by moving a cursor on said stereoscopic projection to a desired x and y tilt angle of said sample stage.

2. Apparatus as claimed in claim 1, wherein said means for generating a plurality of different orientations includes means for receiving information as to the structure of the sample, lattice parameters, current crystal orientation and the relative rotation angle corresponding to the tilting axis.

3. Apparatus as claimed in claim 1, wherein said means for displaying includes means for highlighting a spot representing the current orientation of the sample and a highlighted region in which the sample orientation can be reached by the current position of the sample stage.

4. Apparatus as claimed in claim 1, wherein said means for generating control signals causes the sample stage to be tilted to a zone axis parallel to the electron beam of the electron microscope and, said means for generating a plurality of different orientations includes means for searching by randomly tilting the sample stage within a preset angular region until the operator determines an increased diffraction image contrast.

5. Apparatus as claimed in claim 1, wherein said means for generating control signals causes the sample stage to be tilted along the strongest and/or shortest diffraction vector and further including means for receiving data representative of the orientation angle between the diffraction vector and the tilting axes, and means for determining the difference between the diffraction vector and the tilting axes.

6. Apparatus as claimed in claim 4 with a sample having an unknown crystal structure, lattice parameters and random orientation, wherein a zone axis is obtained and said means for generating control signals causes the sample stage to be tilted along the strongest and/or shortest diffraction vector and further including means for receiving data representative of the orientation angle between the diffraction vector and the tilting axes, means for determining the difference between the diffraction vector and the tilting axes, whereby the sample stage is tilted along every diffraction vector and the reciprocal space is constructed within the angle region which is confined by the limit of the tilting angle of the sample stage.

7. A method for controlling the tilting of the sample stage of an electron microscope along respective x and y axes, comprising:
   tilting the sample stage about respective and axes in response to control signals;
   generating a plurality of different orientations of the sample stage and stereoscopically displaying said plurality of orientations on a monitor to form a stereoscopic projection to be observed by an operator; and
   generating said control signals by moving a cursor on said stereoscopic projection to a desired x and y tilt angle of said sample stage.

8. A method as claimed in claim 7, wherein the generating of a plurality of different orientations includes the receiving of information as to the structure of the sample, lattice parameters, current crystal orientation and the relative rotation angle corresponding to the tilting axis.

9. A method as claimed in claim 7, wherein the displaying said plurality of orientations includes highlighting a spot representing the current orientation of the sample and highlighting a region in which the sample orientation can be reached by the current position of the sample stage.

10. A method as claimed in claim 7, wherein the generation of control signals causes the sample stage to be tilted to a zone axis parallel to the electron beam of the electron microscope and the generating of a plurality of different orientations includes searching by randomly tilting the sample stage within a preset angular region until the operator determines an increased diffraction image contrast.

11. A method as claimed in claim 7, wherein the generating of control signals causes the sample stage to be tilted along the strongest and/or shortest diffraction vector and further including receiving data representative of the orientation angle between the diffraction vector and the tilting axes, and determining the difference between the diffraction vector and the tilting axes.

12. A method as claimed in claim 10 with a sample having an unknown crystal structure lattice parameters and random orientation, wherein a zone axis is obtained and the generating of control signals causes the sample stage to be tilted along the strongest and/or shortest diffraction vector, and further including receiving data representative of the orientation angle between the diffraction vector and the tilting axes, determining the difference between the diffraction vector and the tilting axes, whereby the sample stage is tilted along every diffraction vector and the reciprocal space is constructed within the angle region which is confined by the limit of the tilting angle of the sample stage.

* * * * *